(12) United States Patent
Chang et al.

(10) Patent No.: US 11,527,472 B2
(45) Date of Patent: Dec. 13, 2022

(54) ELECTRONIC PACKAGE, SUPPORTING STRUCTURE AND FABRICATION METHOD THEREOF

(71) Applicant: SILICONWARE PRECISION INDUSTRIES CO., LTD., Taichung (TW)

(72) Inventors: Cho-Hsin Chang, Taichung (TW); Hao-Ju Fang, Taichung (TW); Ting-Wei Chi, Taichung (TW); Te-Fang Chu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/868,038

(22) Filed: May 6, 2020

(65) Prior Publication Data
US 2021/0305148 A1 Sep. 30, 2021

(30) Foreign Application Priority Data
Mar. 25, 2020 (TW) .................. 109110013

(51) Int. Cl.
*H01L 23/498* (2006.01)
*H01L 21/48* (2006.01)

(52) U.S. Cl.
CPC .... *H01L 23/49872* (2013.01); *H01L 21/4842* (2013.01)

(58) Field of Classification Search
None
See application file for complete search history.

(56) References Cited

U.S. PATENT DOCUMENTS

| | | | | |
|---|---|---|---|---|
| 3,959,874 A * | 6/1976 | Coucoulas | .......... | H01L 23/3121 29/856 |
| 7,122,457 B2 * | 10/2006 | Tanida | .......... | H01L 23/481 438/612 |
| 7,253,527 B2 * | 8/2007 | Tanida | .......... | H01L 23/481 257/774 |
| 7,633,765 B1 * | 12/2009 | Scanlan | .......... | H01L 24/18 361/760 |
| 7,714,453 B2 * | 5/2010 | Khan | .......... | H01L 21/561 257/787 |
| 8,685,790 B2 * | 4/2014 | Magnus | .......... | H01L 24/96 438/106 |
| 9,024,349 B2 * | 5/2015 | Chitnis | .......... | H01L 33/62 257/99 |
| 9,236,304 B2 * | 1/2016 | Kim | .......... | H01L 21/78 |
| 9,275,941 B2 * | 3/2016 | Zhu | .......... | H01L 23/49524 |
| 9,343,360 B2 * | 5/2016 | Obu | .......... | H03H 9/059 |
| 9,536,800 B2 * | 1/2017 | Ashrafzadeh | ..... | H01L 23/49541 |
| 9,780,081 B2 * | 10/2017 | Tan | .......... | H01L 24/11 |
| 10,417,548 B2 * | 9/2019 | Mathieu | .......... | G06K 19/07733 |
| 10,770,432 B2 * | 9/2020 | Ziglioli | .......... | H01L 23/528 |
| 2005/0009329 A1 * | 1/2005 | Tanida | .......... | H01L 23/481 438/667 |

(Continued)

*Primary Examiner* — Bo B Jang
(74) *Attorney, Agent, or Firm* — Kelly & Kelley, LLP

(57) ABSTRACT

A supporting structure is provided, which forms a protective layer on a metal member having a plurality of conductive posts, and the protective layer is exposed from end surfaces of the conductive posts, such that conductors are formed on the end surfaces of the conductive posts, thereby avoiding damage of the protective layer.

14 Claims, 5 Drawing Sheets

(56) References Cited

U.S. PATENT DOCUMENTS

| | | | |
|---|---|---|---|
| 2006/0192299 A1* | 8/2006 | Hashimoto | H01L 24/82 257/782 |
| 2007/0018320 A1* | 1/2007 | Tanida | H01L 25/0657 257/737 |
| 2007/0273049 A1* | 11/2007 | Khan | H01L 21/56 257/787 |
| 2008/0173884 A1* | 7/2008 | Chitnis | H01L 33/508 257/98 |
| 2008/0258278 A1* | 10/2008 | Ramos | H01L 23/49575 257/676 |
| 2013/0207255 A1* | 8/2013 | Magnus | H01L 24/19 257/712 |
| 2014/0151874 A1* | 6/2014 | Obu | H03F 3/195 257/737 |
| 2014/0199796 A1* | 7/2014 | Kim | H01L 24/18 438/27 |
| 2015/0102476 A1* | 4/2015 | Zhu | H01L 23/49541 257/676 |
| 2015/0162270 A1* | 6/2015 | Ashrafzadeh | H01L 23/49575 257/666 |
| 2016/0284638 A1* | 9/2016 | Tan | H01L 24/11 |
| 2017/0270398 A1* | 9/2017 | Mathieu | G06K 19/07722 |
| 2019/0287944 A1* | 9/2019 | Ziglioli | H01L 24/33 |
| 2019/0355577 A1* | 11/2019 | Kim | C09D 11/52 |

\* cited by examiner

ELECTRONIC PACKAGE, SUPPORTING STRUCTURE AND FABRICATION METHOD THEREOF

CROSS-REFERENCE TO RELATED APPLICATIONS

This application claims priority to Taiwan Application Serial No. 109110013, filed on Mar. 25, 2020. The entirety of the above-mentioned patent application is hereby incorporated by reference herein and made a part of this specification.

BACKGROUND

1. Technical Field

The present disclosure relates to packaging structures and fabrication methods thereof, and more particularly, to an electronic package, and a supporting structure and a fabrication method thereof.

2. Description of Related Art

Along with the rapid development of portable electronic products in recent years, related products have been developed toward the trend of high density, high performance and miniaturization. Accordingly, various semiconductor packaging structures applied to the portable electronic products have been developed to meet the requirements of high density and miniaturization.

FIGS. 1A to 1D are schematic cross-sectional views illustrating a method for fabricating a semiconductor package 1 according to the prior art.

As shown in FIG. 1A, a lead frame 15 is provided, which comprises a supporting plate 152, a bonding pad 151 and a plurality of conductive posts 150 spacingly arranged on the supporting plate 152.

As shown in FIG. 1B, a protective layer 19 such as a copper-containing agent is formed on the lead frame 15, and a solder material 13 is formed on end surfaces of the conductive posts 150 through such as a flux 17 containing rosin.

As shown in FIG. 1C, an electronic component is bonded onto the conductive posts 150 so as to be stacked on the lead frame 15. The electronic component comprises a substrate structure 10, and a first semiconductor chip 11 and a second semiconductor chip 12 disposed on the substrate structure 10. Further, the first semiconductor chip 11 is bonded onto the bonding pad 151 through a thin film 18. Furthermore, the conductive posts 150 are bonded onto the substrate structure 10 through the solder material 13. In addition, the electronic component further comprises a covering layer 14 covering the second semiconductor chip 12.

As shown in FIG. 1D, an encapsulant 16 is formed between the substrate structure 10 and the lead frame 15 (the supporting plate 152) to encapsulate the first semiconductor chip 11, the solder material 13 and the conductive posts 150. Thereafter, the supporting plate 152 is removed so as to expose end surfaces of the conductive posts 150 and the bonding pad 151 from the encapsulant 16.

However, in the method for fabricating the semiconductor package 1 according to the prior art, since the flux 17 is in a liquid state during a high temperature process, it will permeate to the protective layer 19 along sides of the conductive posts 150 and damage the protective layer 19. As such, when the solder material 13 is reflowed, since no protective layer 19 remains on the lead frame 15 and the sides of the conductive posts 150, the solder material 13 is prone to overflow, thereby leading to channeling of tin, as shown in FIG. 1B'. Consequently, the solder material 13 is electrically connected to the first semiconductor chip 11 and a short circuit occurs.

Therefore, how to overcome the above-described drawbacks of the prior art has become an urgent issue in the art.

SUMMARY

In view of the above-described drawbacks, the present disclosure provides a supporting structure, which comprises: a metal member having a plurality of conductive posts; a protective layer formed on the metal member and exposing end surfaces of the conductive posts; and conductors formed on the end surfaces of the conductive posts.

In the above-described supporting structure, the conductors comprise a solder material.

The present disclosure further provides a supporting structure, which comprises: a metal member having a plurality of conductive posts; stop bodies formed on end surfaces of the conductive posts; and a protective layer formed on the metal member and the stop bodies.

In the above-described supporting structure, the stop bodies comprise ink.

In the above-described two supporting structures, the metal member is a copper frame.

In the above-described two supporting structures, the protective layer is a metal layer. For example, the metal layer comprises aluminum, stainless steel, iron, nickel or chromium.

The present disclosure further provides a method for fabricating a supporting structure, which comprises: providing a metal member having a plurality of conductive posts; forming stop bodies on end surfaces of the conductive posts; forming a protective layer on the metal member and the stop bodies; removing the stop bodies and the protective layer thereon to expose the end surfaces of the conductive posts; and forming conductors on the end surfaces of the conductive posts.

In the above-described method, the stop bodies comprise ink.

The present disclosure further provides a method for fabricating a supporting structure, which comprises: providing a metal member having a plurality of conductive posts; forming a protective layer on the metal member; removing portions of the protective layer to expose end surfaces of the conductive posts; and forming conductors on the end surfaces of the conductive posts.

In the above-described method, the portions of the protective layer are removed by grinding or polishing.

In the above-described two methods, the metal member is a copper frame.

In the above-described two methods, the protective layer is a metal layer. For example, the metal layer is formed by sputtering. In an embodiment, the metal layer comprises aluminum, stainless steel, iron, nickel or chromium.

In the above-described two methods, the conductors comprise a solder material.

The present disclosure further provides an electronic package, which comprises: the supporting structure as described above; and an electronic component bonded onto the conductive posts of the supporting structure to stack the electronic component on the metal member. The present disclosure further provides a method for fabricating an electronic package, which comprises: providing the supporting structure as described above; and bonding an electronic component onto the conductive posts of the supporting structure to stack the electronic component on the metal member.

In the above-described electronic package and fabrication method thereof, the electronic component comprises at least one electronic element.

According to the present disclosure, the end surfaces of the conductive posts are covered by the stop bodies or the protective layer so as to be exposed subsequently. Therefore, compared with the prior art, during reflow of the conductors, the protective layer can prevent overflow of the solder material of the conductors so as to avoid channeling of tin and further prevent a short circuit from occurring between the conductors and the electronic element.

BRIEF DESCRIPTION OF THE DRAWINGS

FIG. 1B' is a schematic view illustrating overflow of the solder material according to the prior art.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2E are schematic cross-sectional views illustrating a method for fabricating an electronic package 2 using a supporting structure 2', 2" according to the present disclosure.

Figure 1A:
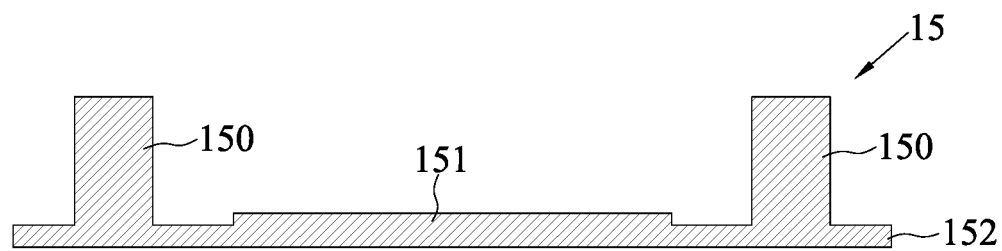
FIGS. 1A to 1D are schematic cross-sectional views illustrating a method for fabricating a semiconductor package according to the prior art.
Figure 1B:
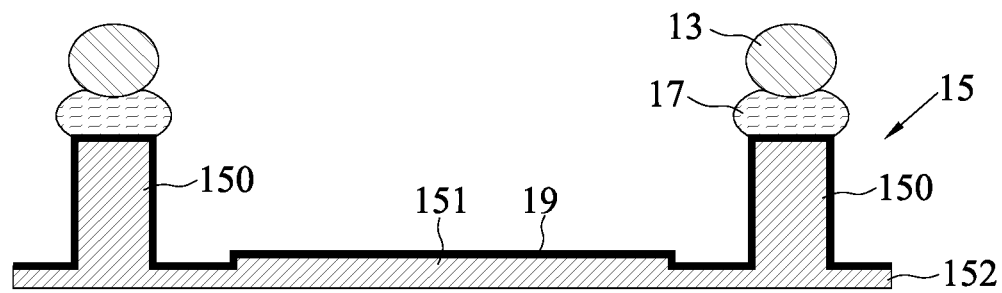
Figure 1B:
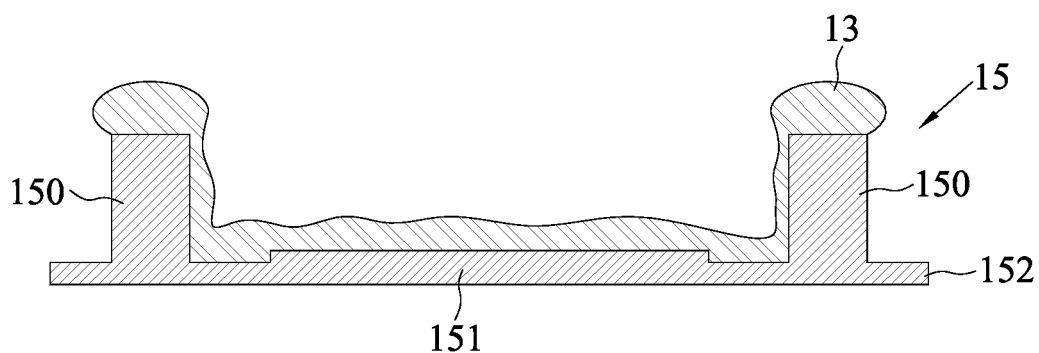
Figure 1C:
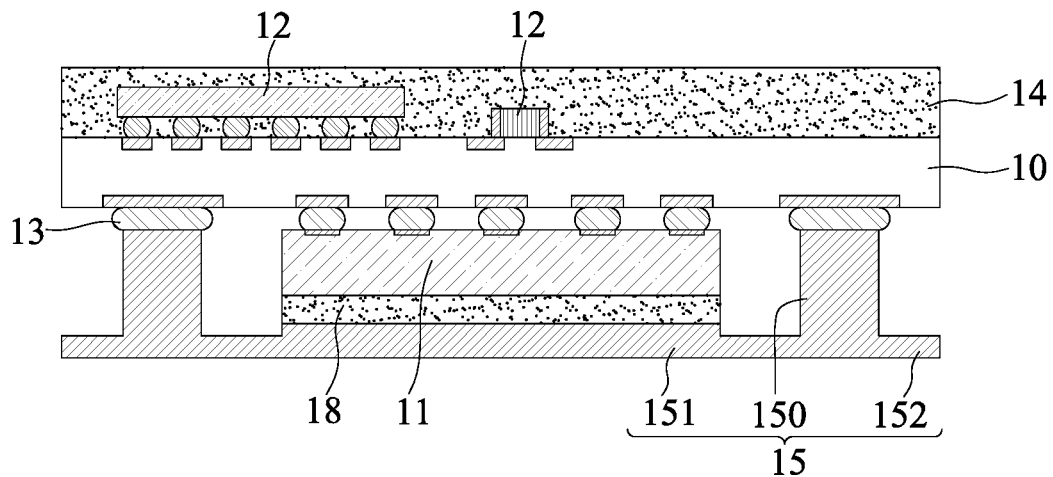
Figure 1D:
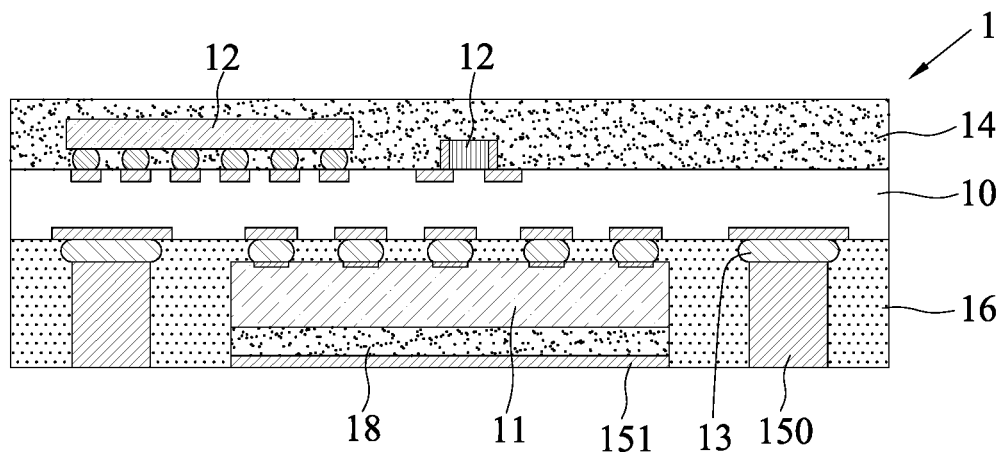
Figure 2A:
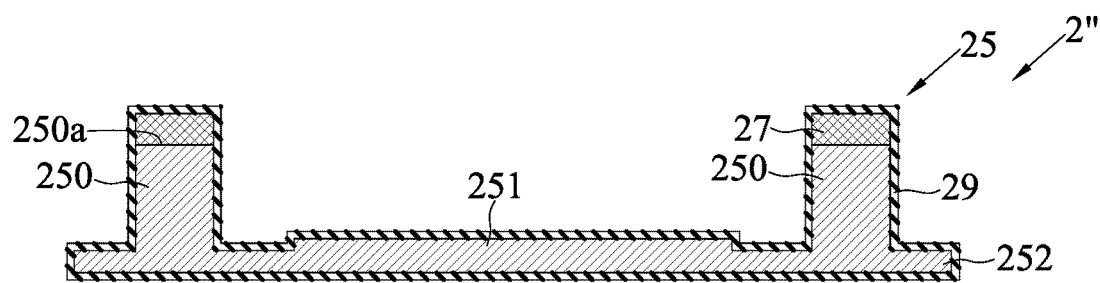
FIGS. 2A to 2C are schematic cross-sectional views illustrating a method for fabricating a supporting structure according to the present disclosure.

As shown in FIG. 2A, a supporting structure 2" having a metal member 25 is provided. The metal member 25 comprises a supporting plate 252, at least a bonding pad 251 and a plurality of conductive posts 250 spacingly arranged on the supporting plate 252.

In an embodiment, the metal member 25 is a lead frame. As such, the supporting plate 252, the bonding pad 251 and the conductive posts 250 can be integrally formed. For example, a copper plate is partially removed by etching, laser ablation and so on so as to form the metal member 25.

Further, stop bodies 27 are formed on end surfaces 250a of the conductive posts 250, and a protective layer 29 is formed on the metal member 25 and the stop bodies 27. For example, the stop bodies 27 are made of ink, and the protective layer 29 is a metal layer having an anti-solder characteristic. The stop bodies 27 are formed by coating, and the protective layer 29 is made of aluminum, stainless steel, iron, nickel, chromium or other metal having an anti-solder characteristic and formed by sputtering.

Figure 2B:
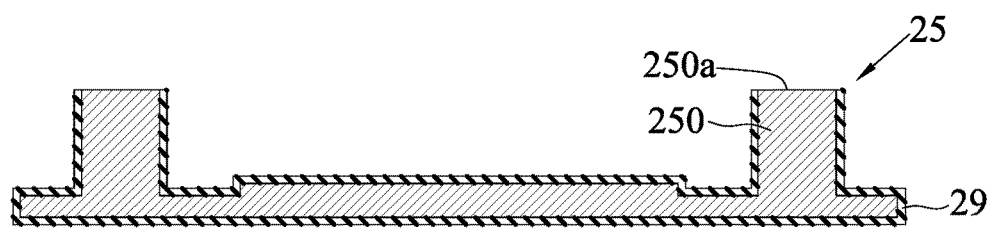

As shown in FIG. 2B, the stop bodies 27 and the protective layer 29 thereon are removed so as to expose the end surfaces 250a of the conductive posts 250.

Figure 2C:
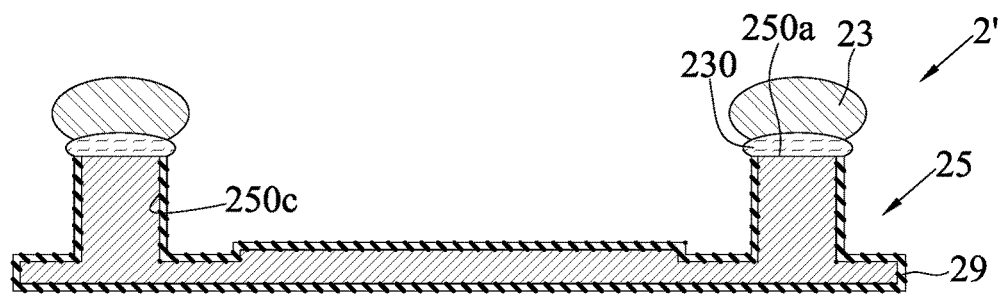

As shown in FIG. 2C, conductors 23 are formed on the end surfaces 250a of the conductive posts 250 so as to form another supporting structure 2'.

In an embodiment, the conductors 23 are made of a solder material or other conductive materials suitable for bonding and formed on the end surfaces 250a of the conductive posts 250 through such as a flux 230 containing rosin.

Figure 3A:
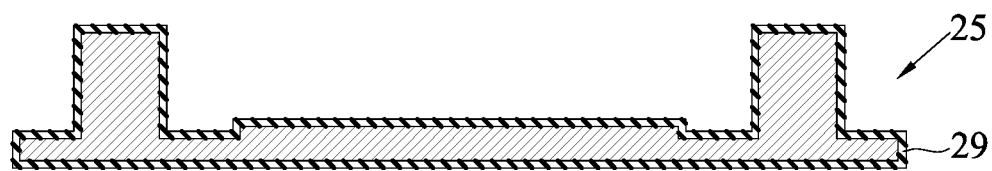
FIGS. 3A and 3B are schematic cross-sectional views illustrating another fabrication method of FIG. 2B.
Figure 3B:
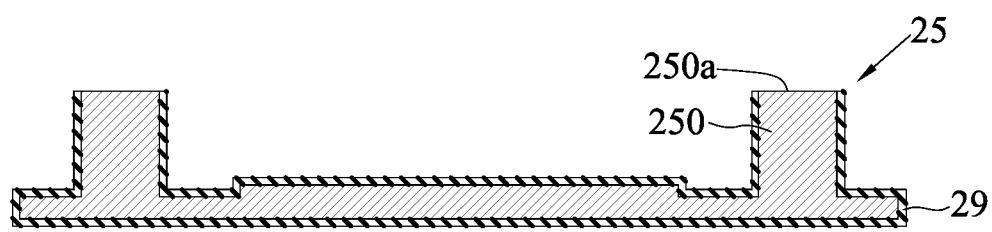

Further, the protective layer 29 is formed on all surfaces of the metal member 25 except the end surfaces 250a of the conductive posts 250. Therefore, in other embodiments, the stop bodies 27 can be omitted. As shown in FIGS. 3A and 3B, the protective layer 29 directly encapsulates the metal member 25 and then portions of the protective layer 29 on the end surfaces 250a of the conductive posts 250 are removed by grinding or polishing. As such, a structure of FIG. 2B or 3B is provided so as for the conductors 23 to be formed thereon.

Figure 2D:
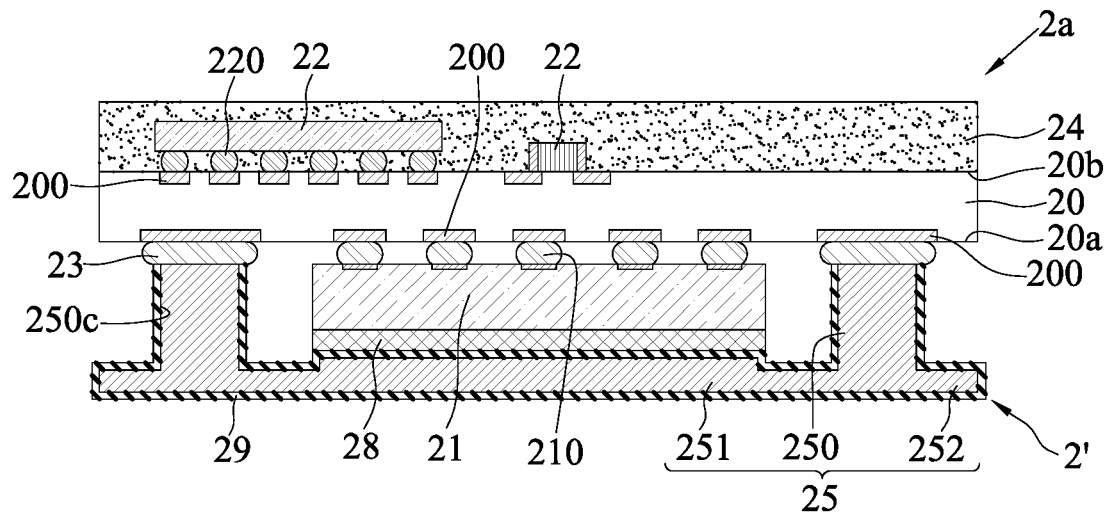
FIGS. 2D to 2E are schematic cross-sectional views illustrating a method for fabricating an electronic package according to the present disclosure.

As shown in FIG. 2D, an electronic component 2a is bonded onto the conductive posts 250 of the supporting structure 2' so as to be stacked on the metal member 25.

In an embodiment, the electronic component 2a comprises a carrier structure 20 and a first electronic element 21 and a second electronic element 22 disposed on the carrier structure 20.

The carrier structure 20 has a first side 20a and a second side 20b opposing the first side 20a. In an embodiment, the carrier structure 20 is a packaging substrate having a core layer and a circuit structure or a coreless circuit structure, which has a plurality of circuit layers 200 such as fan-out redistribution layers (RDLs). It should be noted that the carrier structure 20 can be other carrier units for carrying an electronic element such as a chip. For example, the carrier structure 20 is a lead frame.

The first electronic element 21 is disposed on the first side 20a of the carrier structure 20. In an embodiment, the first electronic element 21 is an active element such as a semiconductor chip, a passive element such as a resistor, a capacitor or an inductor, or a combination thereof. For example, the first electronic element 21 is flip-chip disposed on and electrically connected to the circuit layers 200 through a plurality of conductive bumps 210 made of such as a solder material. Alternatively, the first electronic element 21 can be electrically connected to the circuit layers 200 through a plurality of bonding wires (not shown) in a wire-bonding manner. But it should be noted that the manner in which the first electronic element 21 electrically connects the carrier structure 20 is not limited to the above-described examples.

The second electronic element 22 is disposed on the second side 20b of the carrier structure 20. In an embodiment, the second electronic element 22 is an active element such as a semiconductor chip, a passive element such as a resistor, a capacitor or an inductor, or a combination thereof. For example, the second electronic element 22 is disposed on the circuit layers 200 in a flip-chip manner through a plurality of conductive bumps 220 made of such as a solder material. Alternatively, the second electronic element 22 can be electrically connected to the circuit layers 200 through a plurality of bonding wires (not shown) in a wire-bonding manner. Further, the second electronic element 22 can be in direct contact with the circuit layers 200. But it should be noted that the manner in which the second electronic element 22 electronic connects the carrier structure 20 is not limited to the above-described examples.

Further, the first electronic element 21 can be bonded to the bonding pad 251 through a bonding layer 28. The bonding layer 28 is made of such as a thin film, an epoxy resin or a thermal interface material (TIM).

Furthermore, the conductive posts 250 are bonded to the circuit layers 200 of the first side 20a of the carrier structure 20 through the conductors 23.

In addition, the electronic component 2a has a covering layer 24 formed on the second side 20b of the carrier structure 20 for covering the second electronic element 22. For example, the covering layer 24 is made of, but not limited to, polyimide (PI), a dry film, an epoxy resin, or a molding compound.

Figure 2E:
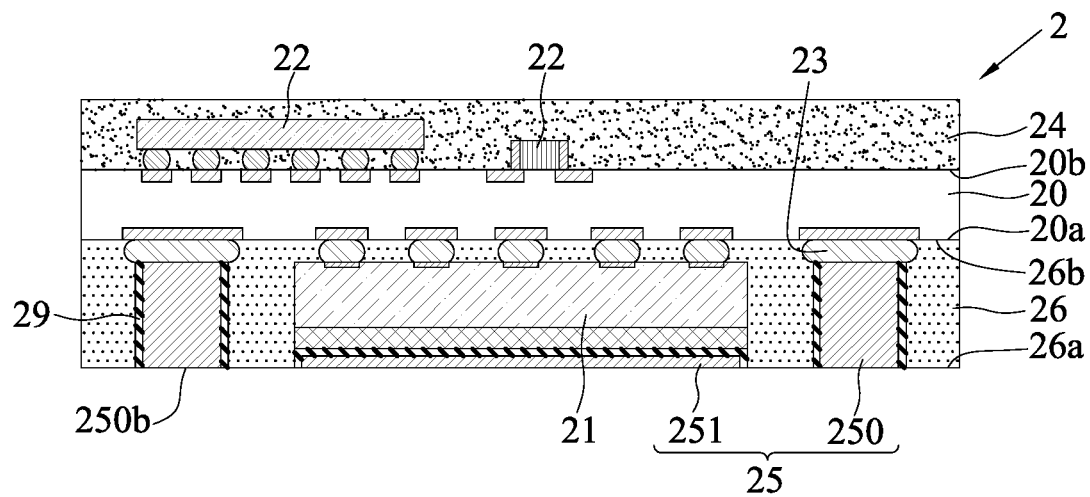

As shown in FIG. 2E, an encapsulant 26 is formed between the first side 20a of the carrier structure 20 and the metal member 25 (the supporting plate 252) to encapsulate the first electronic element 21, the protective layer 29, the conductors 23 and the conductive posts 250. Thereafter, the supporting plate 252 is removed to expose the other end surfaces 250b of the conductive posts 250 and the bonding pad 251 (and even the protective layer 29) from the encapsulant 26, thus forming the electronic package 2 of the present disclosure.

In an embodiment, the encapsulant 26 has a first surface 26a and a second surface 26b opposite to the first surface 26a. The second surface 26b of the encapsulant 26 is bonded to the first side 20a of the carrier structure 20. The conductive posts 250 and the bonding pad 251 are embedded in the first surface 26a of the encapsulant 26, and the end surfaces 250b of the conductive posts 250 and the bonding pad 251 are exposed from the first surface 26a of the encapsulant 26. For example, the end surfaces 250b of the conductive posts 250 and the surface of the bonding pad 251 are flush with the first surface 26a of the encapsulant 26. As such, bumps such as solder balls (not shown) can be mounted on the exposed surfaces (e.g., end surfaces 250b) of the conductive posts 250 for connecting with an electronic device such as a circuit board.

Further, the encapsulant 26 can be made of polyimide, a dry film, an epoxy resin or a molding compound. The encapsulant 26 and the covering layer 24 can be made of the same or different materials.

According to a method for fabricating the semiconductor package 2 of the present disclosure, in the fabrication of the supporting structure 2', 2", the end surfaces 250a of the conductive posts 250 are covered by the stop bodies 27 or the protective layer 29 so as to be exposed subsequently. Therefore, during reflow of the conductors 23, the protective layer 29 remains on the metal member 25 and the side surfaces 250c of the conductive posts 250 so as to prevent overflow of the solder material of the conductors 23, thereby avoiding channeling of tin and further preventing a short circuit from occurring between the conductors 23 and the first electronic element 21 (or the conductive bumps 210).

The present disclosure further provides a supporting structure 2', 2", which includes a metal member 25, a protective layer 29 and conductors 23 (or stop bodies 27).

The metal member 25 has a plurality of conductive posts 250.

The protective layer 29 is formed on the metal member 25 and exposing end surfaces 250a of the conductive posts 250.

The conductors 23 (or the stop bodies 27) are formed on the end surfaces 250a of the conductive posts 250.

In an embodiment, the protective layer 29 is further formed on the stop bodies 27.

In an embodiment, the conductors 23 comprise a solder material.

In an embodiment, the stop bodies 27 comprise ink.

In an embodiment, the metal member 25 is a copper frame.

In an embodiment, the protective layer 29 is a metal layer made of such as aluminum, stainless steel, iron, nickel or chromium.

The present disclosure further provides an electronic package 2, which includes the supporting structure 2' and at least an electronic component 2a.

The electronic component 2a is bonded onto the conductive posts 250 of the supporting structure 2' through the conductors 23 so as to be stacked on the metal member 25.

In an embodiment, the electronic component 2a comprises a first electronic element 21 and/or a second electronic element 22.

According to the present disclosure, the end surfaces of the conductive posts are covered by the stop bodies or the protective layer so as to be exposed subsequently. As such, during reflow of the conductors, the protective layer on the metal member and the side surfaces of the conductive posts can prevent overflow of the solder material of the conductors so as to avoid channeling of tin and further prevent a short circuit from occurring between the conductors and the first electronic element. Therefore, the supporting structure and fabrication method thereof according to the present disclosure can improve the reliability of the electronic package.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating a supporting structure, comprising:

providing a metal member having a plurality of conductive posts, wherein the metal member is a copper frame;

forming a protective layer along a surface of the metal member on the metal member, wherein a contour of the protective layer is the same as that of the metal member;

removing portions of the protective layer to expose end surfaces of the conductive posts; and forming conductors on the end surfaces of the conductive posts.

2. The method of claim 1, further comprising:

before forming the protective layer on the metal member, coating stop bodies of ink on the end surfaces of the conductive posts;

after coating the stop bodies of the ink on the end surfaces of the conductive posts, forming the protective layer on the metal member and the stop bodies; and removing the stop bodies and portions of the protective layer to expose the end surfaces of the conductive posts.

3. The method of claim 1, wherein the portions of the protective layer are removed by grinding or polishing.

4. The method of claim 1, wherein the protective layer is a metal layer.

5. The method of claim 4, wherein the metal layer is formed by sputtering.

6. The method of claim 4, wherein the metal layer comprises aluminum, stainless steel, iron, nickel or chromium.

7. The method of claim 1, wherein the conductors comprise a solder material.

8. An electronic package, comprising:
- a supporting structure including a metal member having a plurality of conductive posts and a protective layer formed on the metal member, wherein the metal member is a copper frame, and the protective layer is along circumference surfaces of the plurality of conductive posts;
- a carrier structure having at least one circuit layer bonded onto the conductive posts to stack the carrier structure on the metal member, wherein the plurality of conductive posts are electrically connected with the circuit layer;
- at least one electronic element disposed on the carrier structure and electrically connected with the circuit layer; and
- an encapsulant formed between the carrier structure and the metal member to encapsulate the protective layer and the conductive posts.

9. The electronic package of claim 8, further comprising a covering layer formed on the carrier structure to cover the electronic element.

10. The electronic package of claim 8, further comprising a plurality of conductors formed on end surfaces of the conductive posts, wherein the plurality of conductors comprise a solder material, and the carrier structure is bonded onto the conductive posts by the plurality of conductors.

11. The electronic package of claim 8, wherein the protective layer exposes end surfaces of the conductive posts.

12. The electronic package of claim 8, wherein the protective layer is a metal layer.

13. The electronic package of claim 12, wherein the metal layer comprises aluminum, stainless steel, iron, nickel or chromium.

14. A method for fabricating an electronic package, comprising:
- providing a supporting structure including a metal member having a plurality of conductive posts and a protective layer formed on the metal member, wherein the metal member is a copper frame, and the protective layer is along circumference surfaces of the plurality of conductive posts;
- bonding a carrier structure having at least one circuit layer onto the conductive posts of the supporting structure to stack the carrier structure on the metal member, wherein the plurality of conductive posts are electrically connected with the circuit layer;
- disposing at least one electronic element on the carrier structure, wherein the electronic element is electrically connected with the circuit layer; and
- forming an encapsulant between the carrier structure and the metal member to encapsulate the protective layer and the conductive posts.

* * * * *